United States Patent
Nomachi et al.

(10) Patent No.: US 6,339,237 B1
(45) Date of Patent: Jan. 15, 2002

(54) SEMICONDUCTOR DEVICE HAVING A MEMORY CELL REGION AND PERIPHERAL CIRCUIT REGION AND METHOD OF MANUFACTURING THE SAME

(75) Inventors: Akiko Nomachi; Hiroshi Takato; Tadaomi Sakurai; Hiroshi Naruse; Koichi Kokubun; Hideaki Harakawa, all of Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/467,078

(22) Filed: Dec. 20, 1999

(30) Foreign Application Priority Data

Dec. 21, 1998 (JP) .......................... 10-362788
Dec. 21, 1998 (JP) .......................... 10-362790

(51) Int. Cl.[7] .............................................. H01L 29/80
(52) U.S. Cl. ..................... 257/282; 257/336; 257/380
(58) Field of Search ................................ 257/392, 336, 257/380, 315–319, 295–296, 357, 282; 438/217, 276, 289, 291, 300

(56) References Cited

U.S. PATENT DOCUMENTS 5,331,191 A * 7/1994 Sugiura et al. ............. 257/336
6,077,763 A * 6/2000 Chen et al. ................. 257/296
6,090,660 A * 7/2000 Noble, Jr. ................... 257/301
6,127,702 A * 10/2000 Yamayaki ................... 257/347
6,143,594 A * 11/2000 Tsao ........................... 438/199

FOREIGN PATENT DOCUMENTS

JP          3-46365         2/1991
JP          09-64294 A  *  3/1997

* cited by examiner

Primary Examiner—Olik Chaudhuri
Assistant Examiner—Nathan W. Ha
(74) Attorney, Agent, or Firm—Finnegan, Henderson, Farabow, Garrett & Dunner, L.L.P.

(57) ABSTRACT

In a MOS transistor of an LDD structure, a cobalt silicide film is formed in a region where adjacent gates are formed widely apart from each other, but is not formed in a region where adjacent gates are formed close to each other. The particular construction permits suppressing the leak current through the PN junction that is generated under the influence of the metal silicide compound in the region where adjacent gates are formed close to each other, and also permits ensuring the signal processing at a high speed in the region where adjacent gates are formed widely apart from each other.

7 Claims, 6 Drawing Sheets

SEMICONDUCTOR DEVICE HAVING A MEMORY CELL REGION AND PERIPHERAL CIRCUIT REGION AND METHOD OF MANUFACTURING THE SAME

BACKGROUND OF THE INVENTION

The present invention relates to a semiconductor device including a MOS type transistor and a method of manufacturing the same.

In a MOS type transistor, it was customary to form a metal silicide layer by a self-aligned silicidation technology on the gate electrode and source-drain diffusion layers in order to decrease the resistance of the gate electrode and the source-drain diffusion layers.

Figure 16:
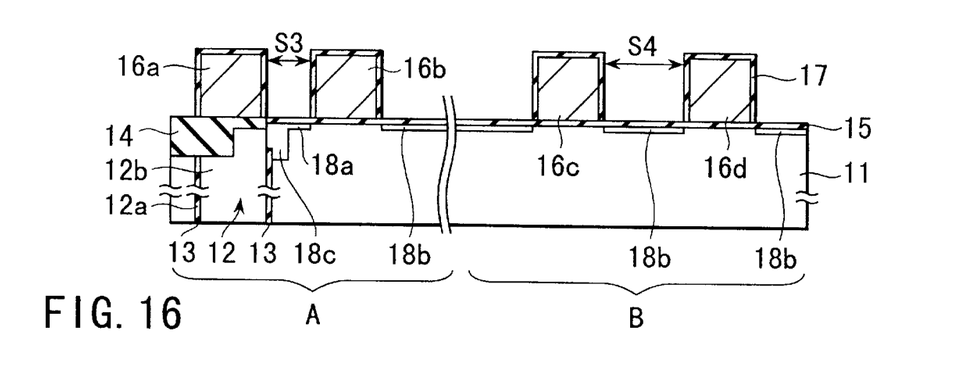
FIG. 16 is a cross sectional view showing a conventional step of manufacturing a semiconductor device.

As shown in FIG. 16, a P-type silicon substrate 11 includes a region A in which is formed, for example, a memory cell, and a region B in which is formed, for example, a peripheral circuit. A deep trench type capacitor 12 is formed selectively within region A of the silicon substrate 11. A capacitor insulating film 13 is formed around a trench 12a of the capacitor 12. The trench 12a is filled with, for example, a poly-crystalline silicon (polysilicon) to form a storage node 12b. Also, an element isolating region 14 consisting of, for example, a silicon oxide film of an STI (Shallow Trench Isolation) structure is formed within the silicon substrate 11.

In the next step, a gate oxide film 15 is formed on the silicon substrate 11, followed by forming polysilicon gates 16a, 16b, 16d, 16c on the gate oxide film 15. The gates 16a and 16b formed in region A are apart from each other by a distance S3. Also, the 16c and 16d formed in region B are apart from each other by a distance S4. A silicon oxide film 17 is formed to cover the surface of each of these gates 16a, 16b, 16c and 16d.

Further, an ion implantation and diffusion are carried out by self-alignment with the gates 16a, 16b, 16c and 16d so as to form N-type diffusion layers 18a and 18b having a low impurity concentration in the source-drain regions. Also, the impurity is diffused outward from, for example, the storage node 12b, or an impurity ions are separately implanted, to form a diffusion layer 18c. The diffusion layer 18c acts as a region for reading the charge of the capacitor 12.

Figure 17:
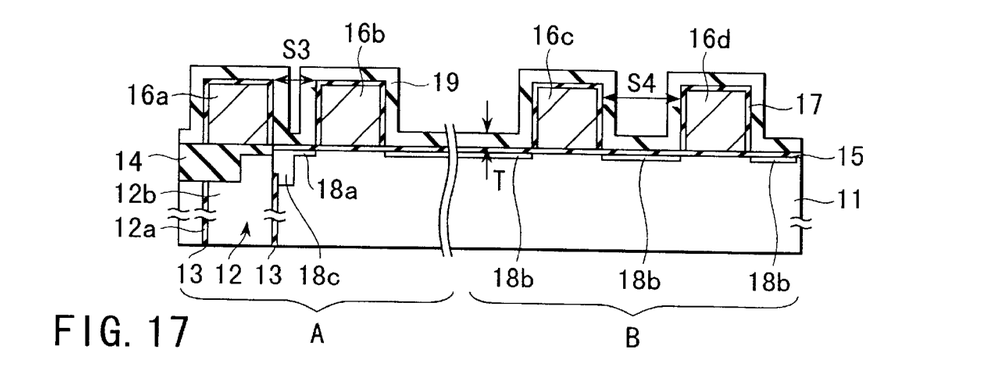
FIG. 17 is a cross sectional view showing a conventional step following the step shown in FIG. 16 of manufacturing a semiconductor device.

In the next step, an insulating film 19 made of, for example, a silicon nitride film having a thickness of, for example, 0.07 $\mu$m is formed on the entire surface by chemical Vapor Deposition (CVD) technique, as shown in FIG. 17.

Figure 18:
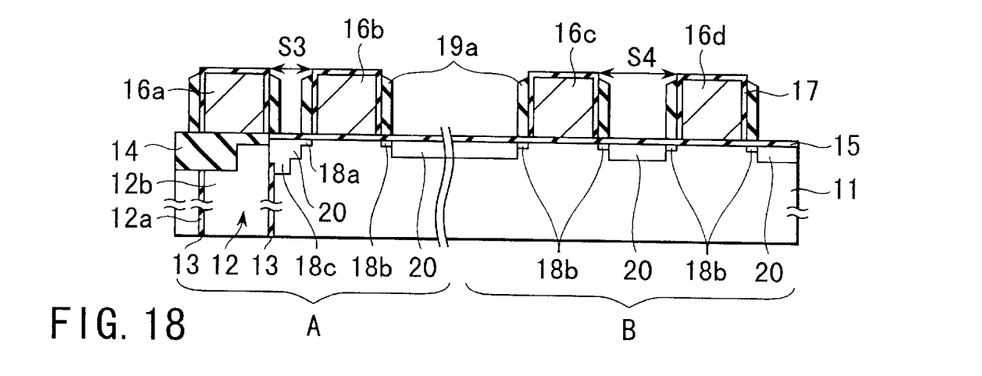
FIG. 18 is a cross sectional view showing a conventional step following the step shown in FIG. 17 of manufacturing a semiconductor device.

Further, the insulating film 19 is selectively removed by an anisotropic etching to permit the insulating film 19 to remain on the side wall portion of each of the gates 16a, 16b, 16c, 16d, thereby forming a gate side wall insulating film 19a, as shown in FIG. 18.

Then, an ion implantation and diffusion are carried out by self-alignment with the gates 16a, 16b, 16c, 16d and the gate side wall insulating film 19a to form an N-type diffusion layer 20 having an impurity concentration higher than that in the diffusion layers 18a, 18b, thereby forming a MOS transistor of an LDD (Lightly Doped Drain) structure. After formation of the N-type diffusion layer 20, the gate oxide film 15 on the diffusion layer 20 and the silicon oxide film 17 on the upper surface of the gates 16a, 16b, 16c, 16d is removed by a wet etching.

Figure 19:
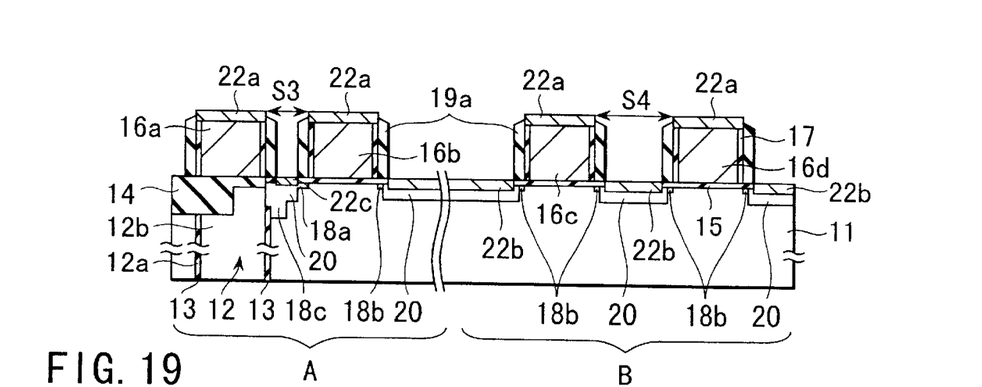
FIG. 19 is a cross sectional view showing a conventional step following the step shown in FIG. 18 of manufacturing a semiconductor device.

Then, a metal film, e.g., a cobalt thin film, is formed on the entire surface, followed by an annealing treatment to a temperature at which a chemical reaction with silicon takes place. As a result, cobalt silicide films are formed by the reaction between cobalt and silicon in regions where the cobalt thin film is in contact with the gates 16a, 16b, 16c, 16d each containing silicon and with the silicon substrate 11. In this step, a cobalt silicide film is not formed on the gate side wall insulating film 19a in which silicon is covered with the insulating film. Then, the unreacted cobalt film is selectively removed by etching. In this fashion, the cobalt silicide films 22b, 22c are formed on the diffusion layers in regions A and B, and the cobalt silicide film 22a is formed on the upper surface of the gates, as shown in FIG. 19.

Formation of the metal silicide layer such as cobalt silicide films 22b, 22c on the diffusion layers is intended to decrease the resistance of the conductive region of the diffusion layer so as to perform the signal processing at a high speed.

However, if a metal silicide layer is formed on the upper surface of the diffusion layer, a difficulty is brought about that a leakage current through the PN junction is increased. Therefore, if a metal silicide layer is formed on the diffusion layer 18a in which the charge of the capacitor 12 is read, the charge holding characteristics of the capacitor 12 are deteriorated. Such being the situation, it is desirable for the cobalt silicide film 22c not to be formed on the diffusion layer 18a.

To be more specific, it is important to suppress the leakage current in order to improve the charge holding characteristics of the capacitor 12 in region A. Also, it is necessary to suppress the resistivity in region B so as to make a high speed operation possible. It follows that it is desirable not to form a cobalt silicide film on the diffusion layer in region A where the leakage current should desirably be suppressed.

In the conventional method of manufacturing a semiconductor device described above, however, a cobalt silicide film is unavoidably formed on the diffusion layer where the distances S3, S4 between the gates are larger than twice the thickness T of the silicon nitride film 19, i.e., (S3, S4)>2×T. Such being the situation, it was impossible to prevent a cobalt silicide film from being formed on the diffusion layer regardless of the thickness T of the silicon nitride film 19.

BRIEF SUMMARY OF THE INVENTION

The present invention, which is intended to overcome the above-noted problems inherent in the prior art, is intended to provide a semiconductor device that permits suppressing the leakage current through the PN junction, which is generated under an influence of a metal silicide compound, and which also permits ensuring the signal processing at a high speed, and a method of manufacturing the particular semiconductor device.

According to a first aspect of the present invention, there is provided a method of manufacturing a semiconductor device, comprising the steps of forming a gate oxide film on a semiconductor substrate; forming selectively a plurality of first gates a first distance apart from each other and a plurality of second gates a second distance, which larger than the first distance, apart from each other on the gate oxide film; forming a first diffusion layer on the surface of the semiconductor substrate with the first and second gates used as a mask; forming an insulating film having a thickness T1 on the entire surface; etching the insulating film by anisotropic etching to decrease the thickness to T2; etching the insulating film to form a first side wall insulating film on the side wall of each of the first gates, the first side wall insulating film covering that region of the semiconductor substrate which is positioned between adjacent first gates, and to form a second side wall insulating film on the side wall of each of the second gates such that the semiconductor substrate surface positioned between adjacent second gates is exposed to the outside; and introducing an impurity into the surface region of the semiconductor substrate with the first and second gates and the first and second side wall insulating films used as a mask to form a second diffusion layer having an impurity concentration higher than that in the first diffusion layer in that region of the surface of the semiconductor substrate which is positioned between adjacent second side wall insulating films.

The first and second gates and the insulating film are formed to meet the relationship $S1 \leq 2 \times T1 < S2$, where S2 denotes the distance between adjacent first gates, S2 denotes the distance between adjacent second gates, and T1 denotes the thickness of the insulating film as formed.

According to a second aspect of the present invention, there is provided a method of manufacturing a semiconductor device, comprising the steps of forming a gate oxide film on a semiconductor substrate; forming selectively a plurality of first gates a first distance apart from each other and a plurality of second gates a second distance, which larger than the first distance, apart from each other on the gate oxide film; forming a first diffusion layer on the surface of the semiconductor substrate with the first and second gates used as a mask; forming a first insulating film on the entire surface; selectively removing the first insulating film to form a first side wall insulating film on each of the side walls of the first and second gates to permit that region of the surface of the semiconductor substrate which is interposed between the first and second gate side walls to be exposed to the outside; introducing an impurity into the surface region of the semiconductor substrate by using the first and second gates and the first side wall insulating film as a mask to form a second diffusion layer contiguous to the first diffusion layer and having an impurity concentration higher than that of the first diffusion layer; forming a second insulating film on the entire surface; and etching the second insulating film to form a second side wall insulating film on the side wall of the first side wall insulating film in a manner to cover the surface of the semiconductor substrate and to form a third side wall insulating film on the side wall of the first side wall insulating film in a manner to expose the surface of the semiconductor substrate to the outside.

The first and second gates and the first and second insulating films are formed to meet the relationship $S1 \leq 2 \times (T1+T2) < S2$, where S1 denotes the distance between adjacent first gates, S2 denotes the distance between adjacent second gates, T1 denotes the thickness of the first insulating film as formed, and T2 denotes the thickness of the second insulating film as formed.

It is possible for the method of the present invention to further comprise the step of removing the first side wall insulating film after formation of the second diffusion layer and before formation of the second insulating film, wherein the first and second gates and the first and second insulating films are formed to meet the relationship $S1 \leq 2 \times T2 < S2$, where S1 denotes the distance between adjacent first gates, S2 denotes the distance between adjacent second gates, T2 denotes the thickness of the second insulating film as formed.

According to a third aspect of the present invention, there is provided a semiconductor device, comprising a plurality of first gates formed on a semiconductor substrate a first distance apart from each other; a plurality of second gates formed on the semiconductor substrates a second distance, which is larger than the first distance, apart from each other; a first side wall insulating film formed on the side wall of each of the first gates to fill the clearance between adjacent first gates; a second side wall insulating film formed on the side wall of each of the second gates, the second side wall insulating gates being apart from each other; a first diffusion layer formed on the surface of the semiconductor substrate positioned below the first side wall insulating films; and a second diffusion layer formed on the surface of the semiconductor substrate positioned between adjacent second side wall insulating films.

The first and second gates and the first and second insulating films are formed to meet the relationship $S1 \leq 2 \times T1 < S2$, where S1 denotes the distance between adjacent first gates, S2 denotes the distance between adjacent second gates, T1 denotes the thickness of each of the first and second insulating films.

In the semiconductor device of the present invention, it is possible for the second side wall insulating film to extend over the second diffusion layer.

The present invention provides a semiconductor device that permits suppressing the leak current through the PN junction, which is generated under the influence of the metal silicide compound, and also permits ensuring the signal processing at a high speed, and a method of manufacturing the particular semiconductor device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some embodiments of the present invention will now be described with reference to the accompanying drawings.

[First Embodiment]

Figure 1:
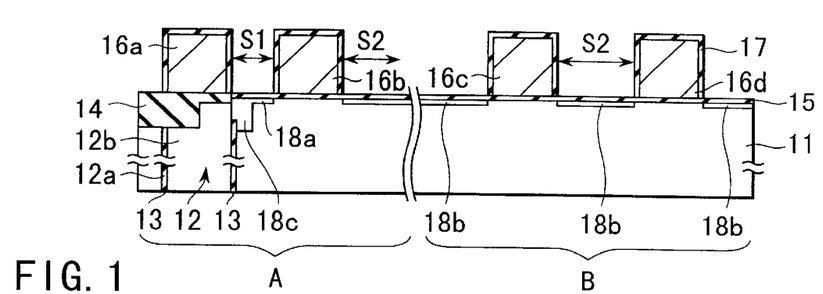
FIG. 1 is a cross sectional view showing a step of manufacturing a semiconductor device according to a first embodiment of the present invention.

In a first embodiment as shown in FIG. 1, a single semiconductor device comprises region A in which it is particularly desired to suppress the leakage current through a PN junction and region B in which it is desired to obtain a conventional construction of a diffusion layer and a conventional resistance in a conductive region of the diffusion layer. A plurality of gate wirings, which are described hereinlater, are arranged in parallel in each of regions A and B. Region A corresponds to a region for forming, for example, a memory cell, and region B corresponds to a region for forming a peripheral circuit requiring a high speed signal processing.

In the first step, a deep trench type capacitor 12 is selectively formed within region A of a silicon substrate 11, as shown in FIG. 1. A capacitor insulating film 13 is formed around a trench 12a of the capacitor 12. The trench 12a is filled with, for example, polysilicon to form a storage node 12b. Also, an element separating region 14 consisting of, for example, a silicon oxide film of an STI (Shallow Trench Isolation) structure is formed within the silicon substrate 11.

In the next step, a gate oxide film 15 is formed on the silicon substrate 11, followed by selectively forming poly-silicon gates 16a, 16b, 16c and 16d on the gate oxide film 15. A maximum distance S1 between adjacent gates 16a and 16b in region A is set at, for example, 0.25 $\mu$m. Also, a minimum distance S2 between adjacent gates 16c and 16d in region B is set at, for example, 0.28 $\mu$m. Also, the distance between the gate in region A and the gate in region B (not shown) is also set at S2. After formation of these gates 16a, 16b, 16c, 16d, a silicon oxide film 17 is formed to cover the outer surfaces of these gates.

Then, an ion implantation into source-drain regions and diffusion are performed by self-alignment with the gates 16a, 16b, 16c, 16d so as to form N-type diffusion layers 18a, 18b each having a low impurity concentration. Also, an impurity is diffused outward from, for example, the storage node 12b, or impurity ions are separately implanted, to form a diffusion layer 18c. The diffusion layer 18c acts as a region for reading the charge of the capacitor 12.

Figure 2:
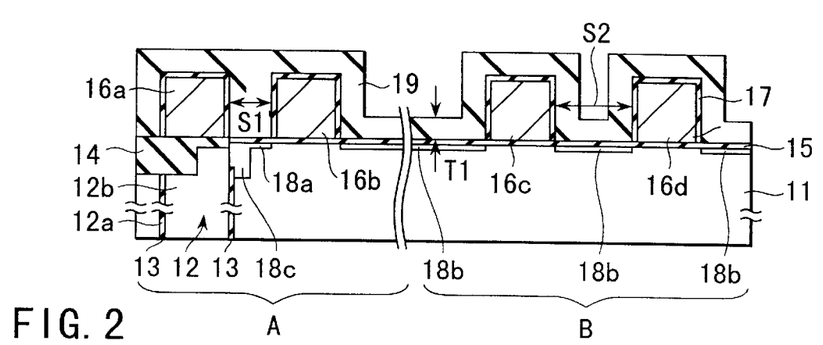
FIG. 2 is a cross sectional view showing a step following the step shown in FIG. 1 of manufacturing a semiconductor device according to the first embodiment of the present invention.

In the next step, an insulating film 19 such as a silicon nitride film is formed on the entire surface by CVD technique, as shown in FIG. 2. The insulating film 19 has a thickness T1 of, for example, 0.135 $\mu$m. The insulating film 19 is formed substantially isotropically to cover the gates 16a, 16b, 16c and 16d.

Where the thickness that is twice the thickness T1 of the insulating film 19 is not smaller than the distance S1 between adjacent gates, no clearance is formed between the insulating film 19 formed in the thickness T1 on the side surface of the gate 16a and the insulating film 19 formed in the thickness T1 on the side surface of the gate 16b that is positioned the distance S1 apart from the gate 16a. In other words, the space of distance S1 between the gates 16a and 16b is filled with the insulating film 19.

On the other hand, where the thickness that is twice the thickness T1 of the insulating film 19 is smaller than the distance S2 between the adjacent gates 16c and 16d in region B, a clearance is left between the insulating film 19 formed in the thickness T1 on the side surface of the gate 16c and the insulating film 19 formed in the thickness T1 on the side surface of the gate 16d that is positioned the distance S2 apart from the gate 16C, i.e., S2−(2×T1)>0. In other words, the insulating films 19 formed on the side surfaces of the gates 16c and 16d are not in contact with each other.

In region A in which the gates 16a and 16b are formed the distance S1 apart from each other, it is undesirable to form a silicide layer, described later, on the silicon substrate 11. On the other hand, in region B in which the gates 16c and 16d are formed the distance S2 apart from each other, it is desirable to form a silicide layer in the subsequent step on the silicon substrate 11. It follows that it is necessary for the thickness T1 of the insulating film 19 and the distances S1, S2 between adjacent gates to meet the relationship:

$$S1 \leq 2 \times T1 < S2 \tag{1}$$

Figure 3:
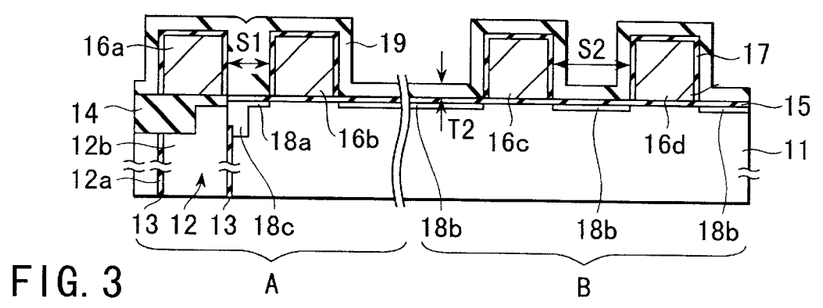
FIG. 3 is a cross sectional view showing a step following the step shown in FIG. 2 of manufacturing a semiconductor device according to the first embodiment of the present invention.

In the next step, the insulating film 19 is isotropically etched for about 9 minutes with a phosphoric acid solution of, for example, 160° C. to form an insulating film 19 having a thickness T2 of 0.07 $\mu$m, as shown in FIG. 3. The thickness T2 of the insulating film 19 is no more than an example. It suffices to determine appropriately the thickness of the insulating film 19 in view of the required performance of a MOS transistor.

Figure 4:
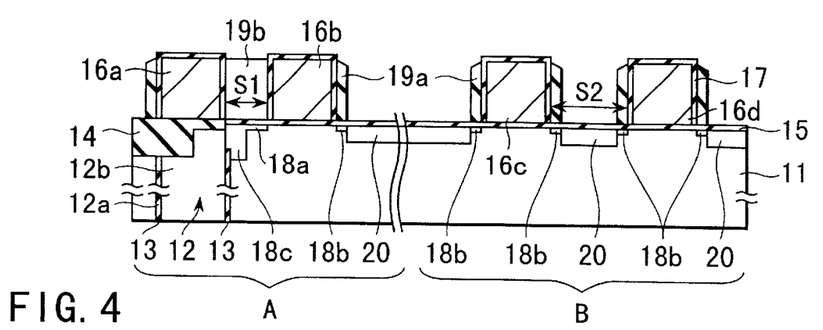
FIG. 4 is a cross sectional view showing a step following the step shown in FIG. 3 of manufacturing a semiconductor device according to the first embodiment of the present invention.

Further, the remaining insulating film 19 having a thickness of about 0.07 $\mu$m is removed by RIE (Reactive Ion Etching) using a mixed gas consisting of, for example, chlorine ($Cl_2$), hydrogen bromide (HBr), oxygen ($O_2$) and sulfur hexafluoride ($SF_6$) to permit gate side wall insulating films 19a, 19b to remain on the side wall of each of the gates 16a, 16b, 16c and 16d, as shown in FIG. 4. It should be noted that the insulating film 19 remains unremoved in this step in a large amount in a narrow region like the clearance of distance S1 between the gates 16a and 16b in region A. As a result, the gate side wall insulating film 19b is formed to prevent the gate oxide film 15 from being exposed to the outside. On the other hand, the gate side wall insulating film 19a is formed to permit the gate oxide film 15 to be exposed to the outside in a wide region like the clearance of distance S2 between the gates 16c and 16d in region B.

After the RIE step, an impurity of, for example, arsenic (As) ions are implanted in a high concentration with the gates 16a, 16b, 16c, 16d and the gate side wall insulating film 19a used as a mask, followed by diffusing the implanted impurities to form an N-type diffusion layer 20 having an impurity concentration higher than that in the diffusion layer 18b and, thus, to form a MOS transistor of LDD structure. After formation of the N-type diffusion layer 20, the gate oxide film 15 on the diffusion layer 20 and the silicon oxide film 17 on the upper surface of the gates 16a, 16b, 16c, 16d is removed by a wet etching.

Figure 5:
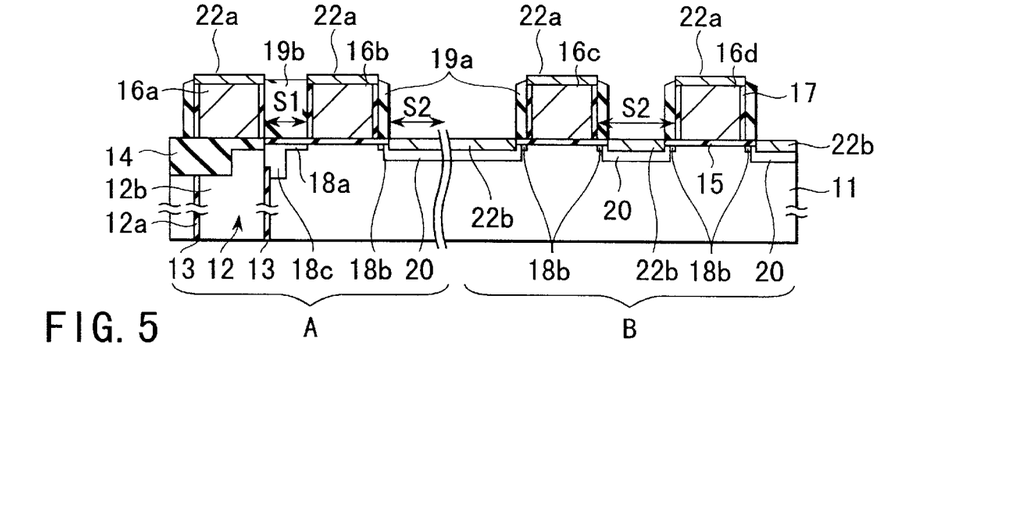
FIG. 5 is a cross sectional view showing a step following the step shown in FIG. 4 of manufacturing a semiconductor device according to the first embodiment of the present invention.

After formation of the N-type diffusion layer 20, a metal film, e.g., a cobalt thin film, is formed in a thickness of, for example, 0.01 µm on the entire surface by a sputtering technique. The metal film is not limited to a cobalt film. For example, a titanium film can be formed in place of the cobalt film. Then, an annealing is performed for one minute under, for example, a nitrogen ($N_2$) atmosphere at a temperature at which a chemical reaction with silicon is to take place, e.g., at 480° C. As a result, reaction between cobalt and silicon takes place in the contact region between the cobalt thin film and the silicon-containing members such as the gates 16a, 16b, 16c, 16d and the silicon substrate 11 so as to form cobalt silicide films 22a, 22b by self-alignment, as shown in FIG. 5. In this step, a cobalt silicide film is not formed in regions covered with the insulating film, i.e., the region between the gates 16a and 16b and on the gate side wall insulating films 19a, 19b. Then, the unreacted cobalt thin film is selectively removed by etching for about 30 seconds with a mixed solution containing, for example, sulfuric acid ($H_2SO_4$) and hydrogen peroxide ($H_2O_2$).

As a result, manufactured is a MOS transistor, in which the cobalt silicide film 22b is not formed in the narrow region between the gates 16a and 16b in region A, though the cobalt silicide film 22b is formed in the wide regions between the gates 16b and 16c and between the gates 16c and 16d in region B. Incidentally, the cobalt silicide film 22a is formed on the upper surface of each of the gates 16a, 16b, 16c and 16d, and the cobalt silicide films 22a formed on the upper surfaces of the gates 16a, 16b in region A are connected to, for example, bit lines.

In the first embodiment described above, the leak current can be suppressed to a low level because the silicide film is not formed on the diffusion layer 18a in region A, making it possible to improve the charge holding characteristics of the capacitor 12. On the other hand, the conventional construction is formed in region B, with the result that it is possible to obtain the diffusion layers 18b, 20 of the conventional structure. It is also possible to obtain the conventional resistance in the conductive region of the diffusion layers. Since the resistance is suppressed as in the conventional device in region B, the signal processing can be performed at a high speed.

It should also be noted that the region in which a silicide film is not formed in region A can be formed by self-alignment, making it possible to omit the step of covering in advance the region in which the silicide film is not formed in forming the silicide film. It follows that it is possible to suppress an increase in the number of manufacturing steps.

[Second Embodiment]

Figure 6:
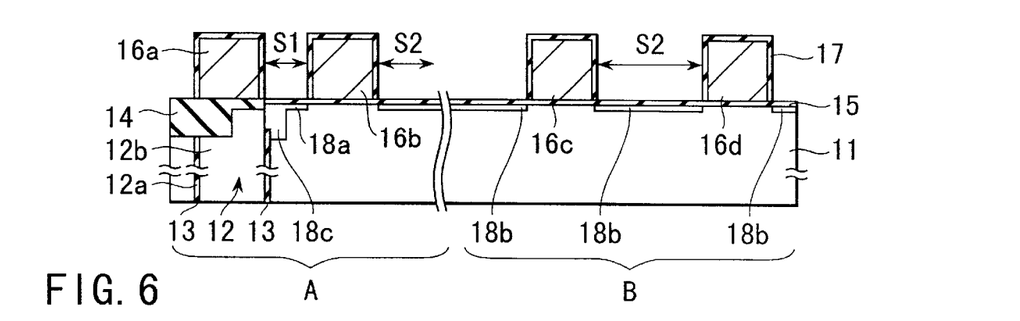
FIG. 6 is a cross sectional view showing a step of manufacturing a semiconductor device according to a second embodiment of the present invention.

FIGS. 6 to 12 are directed to a second embodiment of the present invention. As shown in FIG. 6, the second embodiment also comprises regions A and B, as in the first embodiment.

In the first step, a deep trench type capacitor 12 is selectively formed within region A of a silicon substrate 11, as shown in FIG. 6. A capacitor insulating film 13 is formed around a trench 12a of the capacitor 12. The trench 12a is filled with, for example, polysilicon to form a storage node 12b. Also, an element separating region 14 consisting of, for example, a silicon oxide film of an STI structure is formed within the silicon substrate 11.

In the next step, a gate oxide film 15 is formed on the silicon substrate 11, followed by selectively forming polysilicon gates 16a, 16b, 16c and 16d on the gate oxide film 15. A maximum distance S1 between adjacent gates 16a and 16b in region A is set at, for example, 0.2 µm. Also, a minimum distance S2 between adjacent gates 16c and 16d in region B is set at, for example, 0.32 µm. Also, the distance between the gate in region A and the gate in region B (not shown) is also set at S2. After formation of these gates 16a, 16b, 16c, 16d, a silicon oxide film 17 is formed to cover the outer surfaces of these gates.

Then, an ion implantation into source-drain regions and diffusion are performed by self-alignment with the gates 16a, 16b, 16c, 16d so as to form N-type diffusion layers 18a, 18b each having a low impurity concentration. Also, an impurity is diffused outward from, for example, the storage node 12b, or impurity ions are separately implanted, to form a diffusion layer 18c. The diffusion layer 18c acts as a region for reading the charge of the capacitor 12.

Figure 7:
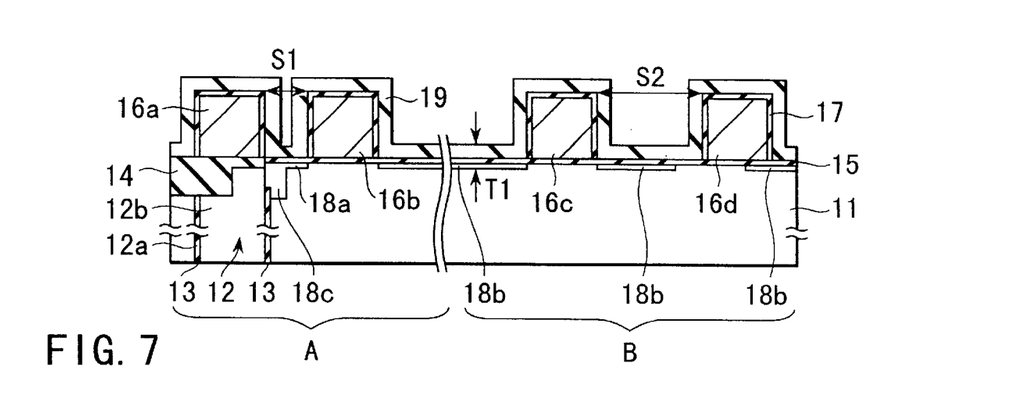
FIG. 7 is a cross sectional view showing a step following the step shown in FIG. 6 of manufacturing a semiconductor device according to the second embodiment of the present invention.

In the next step, an insulating film 19 such as a silicon nitride film is formed on the entire surface by CVD technique, as shown in FIG. 7. The insulating film 19 has a thickness T1 of, for example, 0.07 µm.

Figure 8:
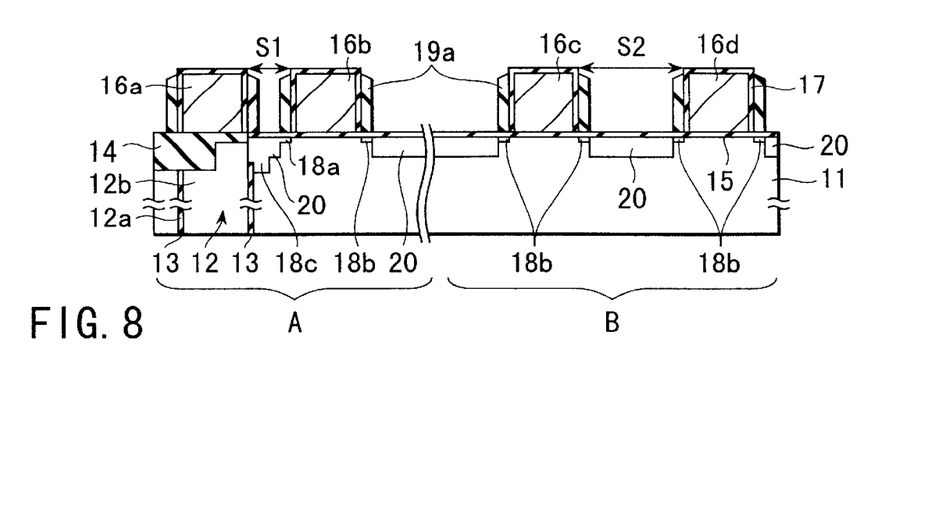
FIG. 8 is a cross sectional view showing a step following the step shown in FIG. 7 of manufacturing a semiconductor device according to the second embodiment of the present invention.

Further, the remaining insulating film 19 having a thickness of about 0.08 µm is removed by RIE using a mixed gas consisting of, for example, chlorine ($Cl_2$), hydrogen bromide (HBr), oxygen ($O_2$) and sulfur hexafluoride ($SF_6$) to permit gate side wall insulating films 19a, 19b to remain on the side wall of each of the gates 16a, 16b, 16c and 16d, as shown in FIG. 8.

After the RIE step, an impurity of, for example, arsenic (As) ions are implanted in a high concentration with the gates 16a, 16b, 16c, 16d and the gate side wall insulating film 19a used as a mask, followed by diffusing the implanted impurities to form an N-type diffusion layer 20 having an impurity concentration higher than that in the diffusion layer 18b and, thus, to form a MOS transistor of LDD structure.

Figure 9:
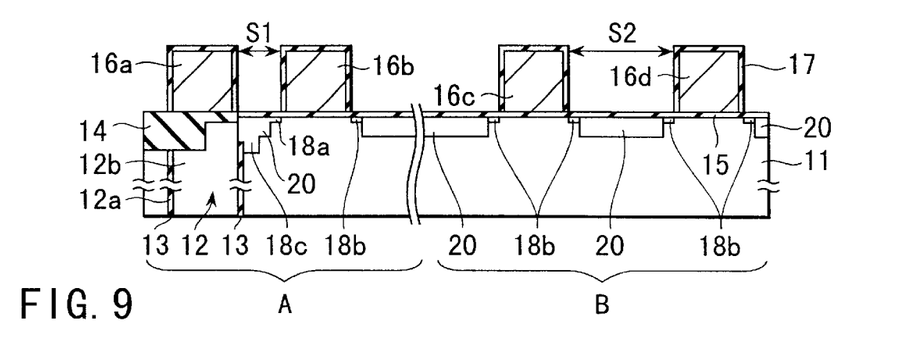
FIG. 9 is a cross sectional view showing a step following the step shown in FIG. 8 of manufacturing a semiconductor device according to the second embodiment of the present invention.

In the next step, the gate side wall insulating film 19a is removed by a wet etching using a phosphoric acid solution of, for example, 160° C., as shown in FIG. 9.

Figure 10:
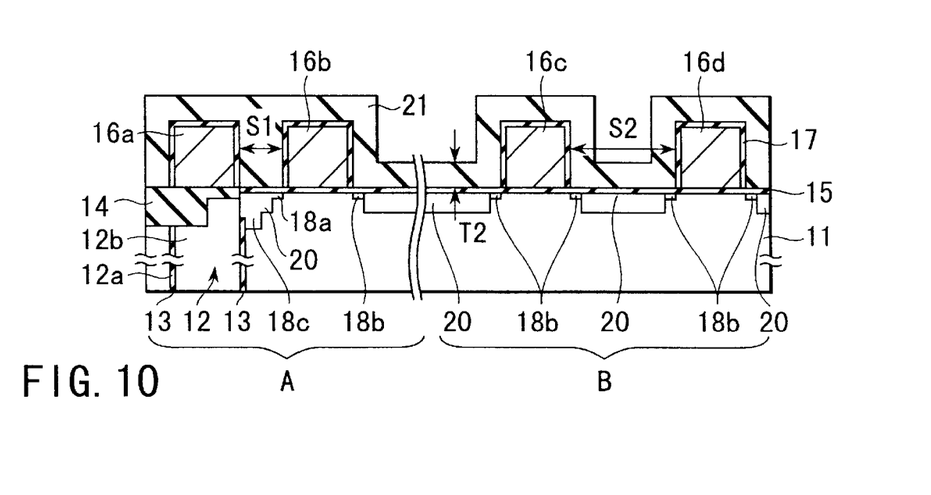
FIG. 10 a cross sectional view showing a step following the step shown in FIG. 9 of manufacturing a semiconductor device according to the second embodiment of the present invention.

Then, an insulating film 21 such as a silicon nitride film is formed on the entire surface by CVD technique, as shown in FIG. 10. The insulating film 21, which has a thickness T2 of, for example, 0.13 µm, is formed substantially isotropically to cover the gates 16a, 16b, 16c and 16d.

Where the thickness that is twice the thickness T2 is larger than the distance S1 between the adjacent gates 16a and 16b, no clearance is left between the insulating film 21 formed in the thickness T2 on the side surface of the gate 16a and the insulating film 21 formed in the thickness T2 on the side surface of the gate 16b that is positioned the distance S1 apart from the gate 16a. In other words, the space of distance S1 between the gates 16a and 16b is filled with the insulating film 21.

On the other hand, where the thickness that is twice the thickness T2 of the insulating film 21 is smaller than the distance S2 between the adjacent gates 16c and 16d in region B, a clearance is left between the insulating film 21 formed in the thickness T2 on the side surface of the gate 16c and the insulating film 21 formed in the thickness T2 on the side surface of the gate 16d that is positioned the distance S2 apart from the gate 16c, i.e., S2−(2×T2)>0. In other words, the insulating films 21 formed on the side surfaces of the gates 16c and 16d are not in contact with each other.

In region A in which the gates 16a and 16b are formed the distance S1 apart from each other, it is desirable not to form a silicide layer, described later, on the silicon substrate 11. On the other hand, in region B in which the gates 16c and 16d are formed the distance S2 apart from each other, it is desirable to form a silicide layer in the subsequent step on the silicon substrate 11. It follows that it is necessary for the thickness T2 of the insulating film 21 and the distances S1, S2 between adjacent gates to meet the relationship:

$$S1 \leq 2 \times T2 < S2 \quad (2)$$

Figure 11:
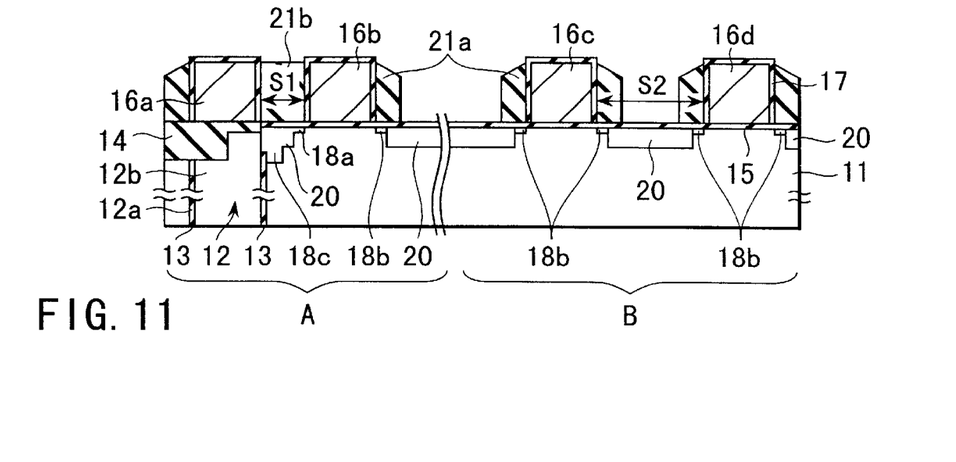
FIG. 11 is a cross sectional view showing a step following the step shown in FIG. 10 of manufacturing a semiconductor device according to the second embodiment of the present invention.

In the next step, the insulating film 21 is etched in a thickness of about 0.14 μm by RIE using a mixed gas containing, for example, chlorine ($Cl_2$), hydrogen bromide (HBr), oxygen ($O_2$) and sulfur hexafluoride ($SF_6$), as shown in FIG. 11. In other words, gate side wall insulating films 21a, 21b are formed on the side wall portion of each of the gates 16a, 16b, 16c and 16d. In this step, the insulating film 21 is left unremoved in a large amount in the narrow portion of distance S1 between the gates 16a and 16b in region A, with the result that the gate side wall insulating film 21b is formed such that the gate oxide film 15 is not exposed to the outside. On the other hand, in the wide portion of distance S2 between the gates 16c and 16d, the gate side wall insulating film 21a is formed such that the gate oxide film 15 is exposed to the outside. After formation of the gate side wall insulating film 21a, 21b, the gate oxide film 15 on the diffusion layer 20 and the silicon oxide film 17 on the upper surface of the gates 16a, 16b, 16c, 16d is removed by a wet etching.

Figure 12:
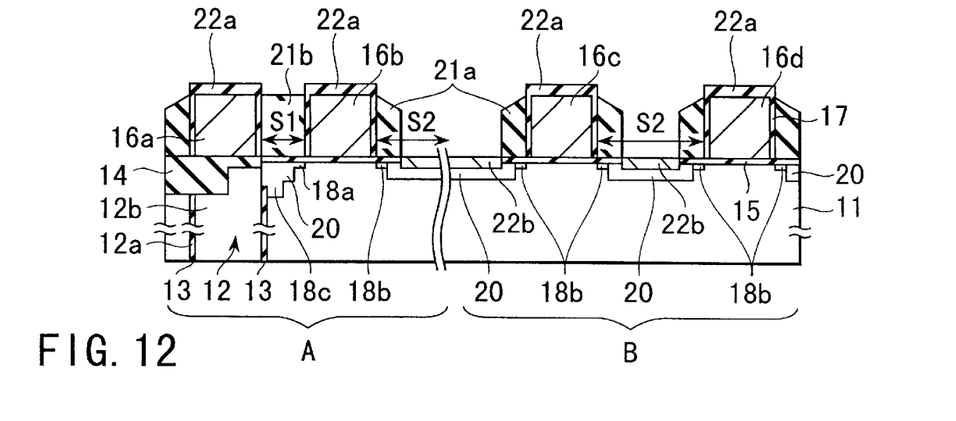
FIG. 12 is a cross sectional view showing a step following the step shown in FIG. 11 of manufacturing a semiconductor device according to the second embodiment of the present invention.

In the next step, a metal film, e.g., a cobalt thin film, is formed in a thickness of, for example, 0.01 μm on the entire surface by a sputtering technique. The metal film is not limited to a cobalt film. For example, a titanium film can be formed in place of the cobalt film. Then, an annealing is performed for one minute under, for example, a nitrogen ($N_2$) atmosphere at a temperature at which a chemical reaction with silicon is to take place, e.g., at 480° C. As a result, reaction between cobalt and silicon takes place in the contact region between the cobalt thin film and the silicon-containing members such as the gates 16a, 16b, 16c, 16d and the silicon substrate 11 so as to form cobalt silicide films 22a, 22b by self-alignment, as shown in FIG. 12. In this step, a cobalt silicide film is not formed in regions covered with the insulating film, i.e., the region between the gates 16a and 16b and on the gate side wall insulating films 21a, 21b. Then, the unreacted cobalt thin film is selectively removed by etching for about 30 seconds with a mixed solution containing, for example, sulfuric acid ($H_2SO_4$) and hydrogen peroxide ($H_2O_2$).

As a result, manufactured is a MOS transistor, in which the cobalt silicide film is not formed in the narrow region between the gates 16a and 16b in region A, though the cobalt silicide film is formed in the wide regions between the gates 16b and 16c and between the gates 16c and 16d in region B. Incidentally, the cobalt silicide film 22a is formed on the upper surface of each of the gates 16a, 16b, 16c and 16d, and the cobalt silicide films 22a formed on the upper surfaces of the gates 16a, 16b in region A are connected to, for example, bit lines.

In the second embodiment described above, it is possible to form a structure in which a metal silicide compound layer is not formed in the narrow portion of distance S1 between the gates 16a and 16b in region A without changing the construction of the diffusion layers 18a, 18b, 18c and 20 forming the source-drain regions. As a result, it is possible to suppress the leakage current in the narrow portion of distance S1 between the gates 16a and 16b in region A so as to improve the charge holding characteristics of the capacitor 12.

[Third Embodiment]

The common portions of the second and third embodiments are denoted by the same reference numerals so as to avoid an overlapping description, and those portions alone of the third embodiment which differ from the second embodiment are to be referred to in the following description.

Figure 13:
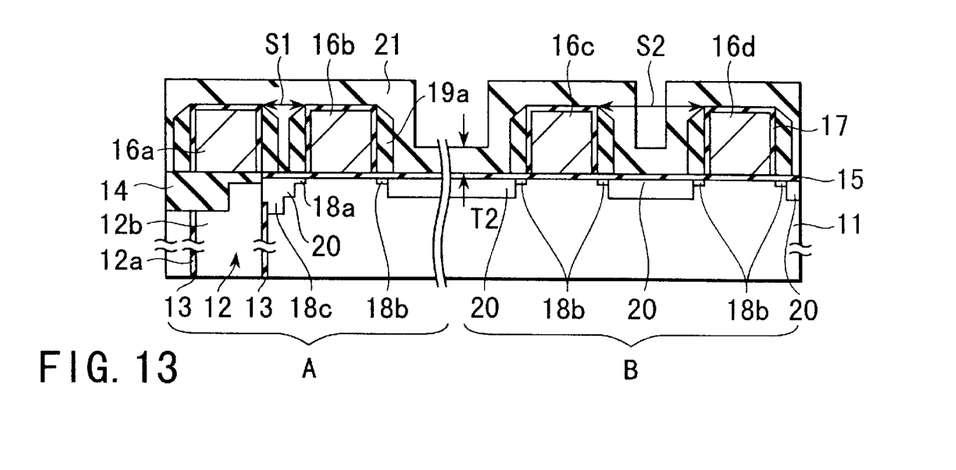
FIG. 13 is a cross sectional view showing a step of manufacturing a semiconductor device according to a third embodiment of the present invention.

In the third embodiment, a gate side wall insulating film 19a is formed in the first step as shown in FIGS. 6 to 8, as in the second embodiment. Then, as shown in FIG. 13, an insulating film 21 such as a silicon nitride film is formed on the entire surface by CVD technique without removing the gate side wall insulating film 19a. The insulating film 21, which has a thickness T2 of, for example, 0.06 μm, is formed substantially isotropically to cover the gates 16a, 16b, 16c and 16d. Also, the side wall insulating film 19a is formed in the thickness T1 on the side surface of each of the gates 16a, 16b, 16c and 16d. It follows that, where the thickness that is twice the thickness (T1+T2) is larger than the distance S1 between the adjacent gates 16a and 16b, no clearance is left between the insulating film 21 formed in the thickness T2 on the side surface of the gate 16a and the insulating film 21 formed in the thickness T2 on the side surface of the gate 16b positioned the distance S1 apart from the gate 16a. In other words, the space of distance S1 between the gates 16a and 16b is filled with the insulating film 21.

On the other hand, where the thickness that is twice the thickness (T1+T2) is smaller than the distance S2 between the adjacent gates 16c and 16d in region B, a clearance is left between the insulating film 21 formed in the thickness T2 on the side surface of the gate 16c and the insulating film 21 formed in the thickness T2 on the side surface of the gate 16d, i.e., S2−[2×(T1+T2)]>0. In other words, the insulating films 21 formed on the side surfaces of the gates 16c and 16d are not in contact with each other.

In region A in which the gates 16a and 16b are formed the distance S1 apart from each other, it is desirable not to form a silicide layer, described later, on the silicon substrate 11. On the other hand, in region B in which the gates 16c and 16d are formed the distance S2 apart from each other, it is desirable to form a silicide layer in the subsequent step on the silicon substrate 11. It follows that it is necessary for the thickness T2 of the insulating film 21, the thickness T1 of the insulating film 19 as formed, and the distances S1, S2 between adjacent gates to meet the relationship:

$$S1 \leq 2 \times (T1+T2) < S2 \quad (3)$$

Figure 14:
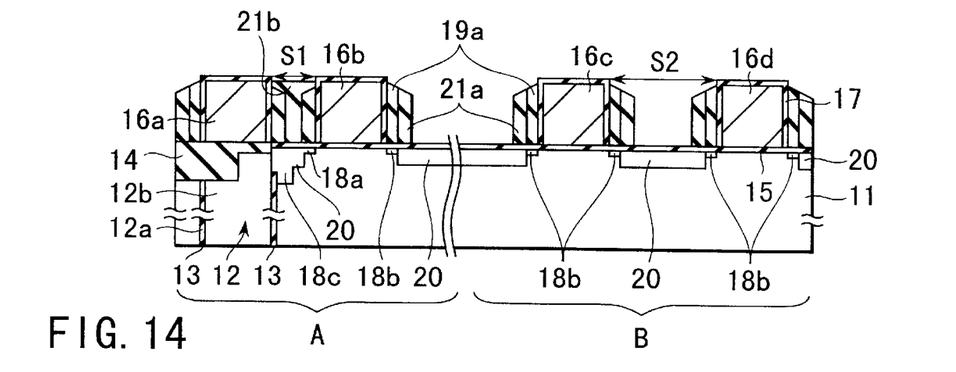
FIG. 14 is a cross sectional view showing a step following the step shown in FIG. 13 of manufacturing a semiconductor device according to the third embodiment of the present invention.

In the next step, the insulating film 21 is etched in a thickness of about 0.14 μm by RIE using a mixed gas containing, for example, chlorine (Cl$_2$), hydrogen bromide (HBr), oxygen (O$_2$) and sulfur hexafluoride (SF$_6$), as shown in FIG. 14. In other words, gate side wall insulating films 21a, 21b are formed on the side wall portion of each of the gates 16a, 16b, 16c and 16d. In this step, the insulating film 21 is left unremoved in a large amount in the narrow portion of distance S1 between the gates 16a and 16b in region A, with the result that the gate side wall insulating film 21b is formed such that the gate oxide film 15 is not exposed to the outside. On the other hand, in the wide portion of distance S2 between the gates 16c and 16d, the gate side wall insulating film 21a is formed such that the gate oxide film 15 is exposed to the outside. After formation of the gate side wall insulating film 21a, 21b, the gate oxide film 15 on the diffusion layer 20 and the silicon oxide film 17 on the upper surface of the gates 16a, 16b, 16c, 16d is removed by a wet etching.

Figure 15:
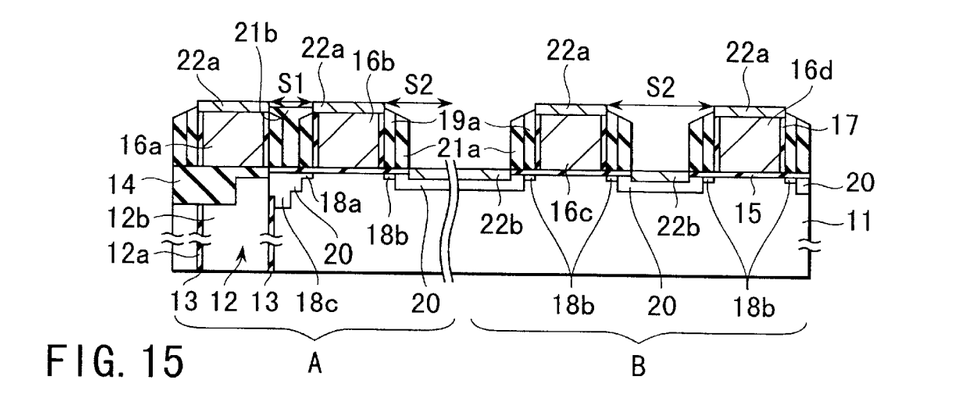
FIG. 15 is a cross sectional view showing a step following the step shown in FIG. 14 of manufacturing a semiconductor device according to the third embodiment of the present invention.

In the next step, a metal film, e.g., a cobalt thin film, is formed in a thickness of, for example, 0.01 μm on the entire surface by a sputtering technique. The metal film is not limited to a cobalt film. For example, a titanium film can be formed in place of the cobalt film. Then, an annealing is performed for one minute under, for example, a nitrogen (N$_2$) atmosphere at a temperature at which a chemical reaction with silicon is to take place, e.g., at 480° C. As a result, reaction between cobalt and silicon takes place in the contact region between the cobalt thin film and the silicon-containing members such as the gates 16a, 16b, 16c, 16d and the silicon substrate 11 so as to form cobalt silicide films 22a, 22b by self-alignment, as shown in FIG. 15. In this step, a cobalt silicide film is not formed in regions covered with the insulating film, i.e., the region between the gates 16a and 16b and on the gate side wall insulating films 19a, 19b, 21a, 21b. Then, the unreacted cobalt thin film is selectively removed by etching for about 30 seconds with a mixed solution containing, for example, sulfuric acid (H$_2$SO$_4$) and hydrogen peroxide (H$_2$O$_2$).

As a result, manufactured is a MOS transistor, in which the cobalt silicide film is not formed in the narrow region between the gates 16a and 16b in region A, though the cobalt silicide film is formed in the wide regions between the gates 16b and 16c and between the gates 16c and 16d in region B. Incidentally, the cobalt silicide film 22a is formed on the upper surface of each of the gates 16a, 16b, 16c and 16d, and the cobalt silicide films 22a formed on the upper surfaces of the gates 16a, 16b in region A are connected to, for example, bit lines.

The third embodiment produces the effect similar to that produced by the second embodiment. Further, the manufacturing process can be simplified because the gate side wall insulating film 19a is not removed in the third embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:

a plurality of first gates formed on a semiconductor substrate a first distance apart from each other;

a plurality of second gates formed on the semiconductor substrates a second distance, which is larger than said first distance, apart from each other;

a first side wall insulating film formed on the side wall of each of said first gates to fill the clearance between adjacent first gates;

a second side wall insulating film formed on the side wall of each of said second gates, said second side wall insulating gates being apart from each other;

a first diffusion layer formed on the surface of the semiconductor substrate positioned below the first side wall insulating films;

a second diffusion layer formed on the surface of the semiconductor substrate positioned between adjacent second side wall insulating films; and a metal silicide compound layer formed on said second diffusion layer and said first and second gates;

wherein a portion of said metal silicide compound layer formed on said second diffusion layer and portions of said metal silicide compound layer formed on said first and second gates are formed of the same material.

2. A semiconductor device according to claim 1, wherein said second diffusion layer has an impurity concentration higher than that in said first diffusion layer.

3. A semiconductor device according to claim 1, wherein the first and second gates and the first and second insulating films are formed to meet the relationship S1≦2×T1<S2, where S1 denotes the distance between adjacent first gates, S2 denotes the distance between adjacent second gates, T1 denotes the thickness of each of the first and second insulating films as formed.

4. A semiconductor device according to claim 1, wherein a capacitor is formed within said semiconductor substrate and is connected to the first diffusion layer.

5. A semiconductor device according to claim 1, wherein said second side wall insulating film extends over the second diffusion layer.

6. A semiconductor device according to claim 1, wherein the second side wall insulating film is formed to extend over the second diffusion layer, and the first and second gates and the first and second insulating films are formed to meet the relationship S1≦2×T1<S2, where S1 denotes the distance between adjacent first gates, S2 denotes the distance between adjacent second gates, T1 denotes the thickness of each of the first and second insulating films as formed.

7. A semiconductor device according to claim 1, wherein the second side wall insulating film is formed to extend over the second diffusion layer, and a capacitor is formed within said semiconductor substrate and is connected to the first diffusion layer.

* * * * *